United States Patent
Shirai et al.

Patent Number: 5,565,131
Date of Patent: Oct. 15, 1996

[54] BISMUTH-SUBSTITUTED RARE EARTH IRON GARNET SINGLE CRYSTAL

[75] Inventors: Kazushi Shirai; Kenji Ishikura; Norio Takeda, all of Tokyo, Japan

[73] Assignee: Mitsubishi Gas Chemical Company, Inc., Tokyo, Japan

[21] Appl. No.: 368,914

[22] Filed: Jan. 5, 1995

[30] Foreign Application Priority Data

Jan. 7, 1994 [JP] Japan .................... 6-000591

[51] Int. Cl.⁶ .................... C30B 29/28; C01G 49/00
[52] U.S. Cl. .................... 252/62.56; 117/937; 423/263
[58] Field of Search .................... 117/1, 2, 934, 117/937, 953, 945; 252/62.57, 584; 423/263; 428/700

[56] References Cited

U.S. PATENT DOCUMENTS

| | | | |
|---|---|---|---|
| 4,168,107 | 9/1979 | Sauter | 350/96.13 |
| 4,582,562 | 4/1986 | Tamaki et al. | 156/624 |
| 5,043,231 | 8/1991 | Miyazawa et al. | 428/700 |
| 5,212,446 | 5/1993 | Itoh et al. | 324/244.1 |
| 5,277,845 | 1/1994 | Ryuo et al. | 252/584 |

FOREIGN PATENT DOCUMENTS

| | | |
|---|---|---|
| 0368483 | 5/1990 | European Pat. Off. . |
| 03282414 | 12/1991 | Japan . |
| 5-339099 | 12/1993 | Japan . |

OTHER PUBLICATIONS

Journal of Applied Physics., H. Umeza et al., vol. 63, No. 8, Apr. 15, 1988, pp. 3113–3115.

"Temperature Dependence of Faraday Rotation for Bi–Substituted Terbium Iron Garnet Films," Y. Honda et al., Nihon Oyo Jiki Gakkaishi, vol. 11, No. 2 (1987).

*Primary Examiner*—R. Bruce Breneman
*Assistant Examiner*—Felisa Garrett
*Attorney, Agent, or Firm*—Burns, Doane, Swecker & Mathis, LLP

[57] ABSTRACT

A bismuth-substituted rare earth iron garnet single crystal film is represented by a general equation $Tb_xLu_yBi_{3-x-y}Fe_{5-z}Al_zO_{12}$ (where $0.09 \leq y/x \leq 0.23$, $1.40 \leq x+y \leq 1.70$, $0.20 \leq z \leq 0.38$) grown on a non-magnetic garnet substrate $(CaGd)_3(MgZrGa)_5O_{12}$ having a lattice constant of 12.490 Å–12.500 Å by a liquid phase epitaxial method. The bithmus-substituted rare earth iron garnet single crystal film satisfies three conditions that (1) the Faraday effect is large, i.e., the film thickness required for the Faraday rotator at a wavelength of 1.55 μm is 450 μm or less, (2) the saturated magnetic field is 800 (Oe) or less, and (3) the temperature coefficient α is 0.07 deg/°C. or less.

10 Claims, 1 Drawing Sheet

BISMUTH-SUBSTITUTED RARE EARTH IRON GARNET SINGLE CRYSTAL

BACKGROUND OF THE INVENTION

1. Field of the Invention

The present invention relates to a bismuth-substituted rare earth iron garnet single crystal used for a Faraday rotator for an optical isolator, and a Faraday rotator for an optical isolator of the bismuth-substituted rare earth iron garnet single crystal. More particularly, the present invention relates to a bismuth-substituted rare earth iron garnet single crystal film represented by a general equation $Tb_xLu_yBi_{3-x-y}Fe_{5-z}Al_zO_{12}$ (where $0.09 \leq y/x \leq 0.23$, $1.40 \leq x+y \leq 1.70$, $0.20 \leq z \leq 0.38$) grown on a non-magnetic garnet substrate $(CaGd)_3(MgZrGa)_5O_{12}$ having a lattice constant of 12.490 Å–12.500 Å by the liquid phase epitaxial method, and an optical isolator Faraday rotator constituted by the bismuth-substituted rare earth iron garnet single crystal.

2. Description of the Prior Art

The semiconductor laser widely used in optical communication and optical measurement has a critical defect that when emitted light is reflected and returned from the end surface of an optical fiber, oscillation becomes unstable. In order to prevent this, an optical isolator is provided on the light emitting side of the semiconductor laser so that reflected/returned light is interrupted by the optical isolator.

The structure of the optical isolator is shown in FIG. 1. In FIG. 1, reference numeral 1 denotes a semiconductor laser, 2 a polarizer, 3 a Faraday rotator of magnetic optical material, 4 an analyzer, and 5 a permanent magnet for magnetically saturating the Faraday rotator. In FIG. 1, the light having passed through the polarizer 2 is a linearly-polarized light which is incident to the Faraday rotator 3. The polarization plane of the linearly polarized light is subjected to rotation of plane by 45° in a clockwise direction (Faraday effect).

The rotation direction of the polarization plane of the Faraday rotator depends on the kind of the Faraday rotator and the magnetization direction of the permanent magnet 5. Now, it is assumed that the polarization plane is rotated clockwise. For brevity and clarification of explanation, as for the rotation direction of the polarization plane, it is assumed that the clockwise rotation is plus and the counter clockwise rotation is minus, when viewed from the light source side (semiconductor laser source side). The rotation angle is measured from the polarization plane permeating direction of the polarizer 2.

The light having permeated through the Faraday rotator becomes linearly polarized light with the polarization plane rotated by plus 45° which is incident to the analyzer 4. In the analyzer 4, which is inclined by plus 45° from the polarizer 2, the polarization plane of the light which is incident to the analyzer 4 is coincident with the polarization plane permeating direction of the polarizer 4. Therefore, the light incident to the analyzer 4 permeates without being interrupted as it is.

On the other hand, the reflected and returned light, after having permeated through the analyzer 4, becomes linearly polarized light with the polarization plane inclined by plus 45°. It permeates through the Faraday rotator 3. Then it is subjected to further rotation of plus 45°. As a result, the inclination angle of the polarization plane when the reflected/returned light has permeated through the Faraday rotator 3 is plus 90°. The light incident to the polarizer 2, since the polarization plane permeating direction in the polarizer 2 forms 90° with the polarization plane, is completely interrupted so that it is not returned to the light source.

The actual assembling of the optical isolator is performed in the way as shown in FIG. 2.

In FIG. 2, reference numeral 1 denotes a semiconductor laser; 2 a polarizer; 3 a Faraday rotator; 4 an analyzer; and 6 a light receiver. In FIG. 2, the permanent magnet is not shown.

In the construction of FIG. 2, a light receiver is located at the position of the semiconductor laser in FIG. 1 whereas the semiconductor laser 1 is located on the light reflected/returned side so that the intensity of the reflected/returned light is measured.

In this state, while the light emitted from the semiconductor laser 1 is received by the light receiver 6, the polarizer 2 is rotated to a position where the intensity of the light detected by the light receiver 6 is minimum. Even when the rotation angle of the Faraday rotator deviates slightly from 45°, the position of the polarizer is adjusted in accordance with the deviation angle $\Delta\Theta$ so that the capability of the optical isolator of interrupting the reflected/returned light is maintained sufficiently. But, for compensation for this, the transmissivity is lowered. Specifically, an increase (hereinafter referred to as "Ld") in the loss due to the angle deviation from 45° of the Faraday rotator is added to the transmissivity.

Ld is expressed by $\sin^2(2\Delta\Theta) \times 100$ (%). For example, assuming that the deviation angle from 45° of the Faraday rotator is 2°, Ld is 0.5%. Therefore, as long as the optical isolator is assembled by the method as shown in FIG. 2, i.e., the method in which the position of the polarizer is trimmed in accordance with the angle of the Faraday rotator, the slight angle deviation from 45° of the Faraday rotator, more concretely 2° or so is not problematic in an actual use.

As described above, the deviation angle $\Delta\Theta$ from 45° of the Faraday rotator, as long as it is 2° or so, is not particularly problematic in the stage of assembling the optical isolator. The angle deviation due to changes in the environmental temperature is problematic. This is because the elements of the optical isolator once assembled are fixed by a bonding agent so that the position of the polarizer cannot be adjusted again as occasion demands in accordance with the angle deviation of the Faraday rotator. Therefore, a change (hereinafter referred to as $\Delta\Theta_t$) in the Faraday rotation angle due to changes in the environmental temperature is a very important factor in developing an optical material.

Generally, for convenience of explanation, the temperature characteristic of the Faraday effect of the Faraday rotator material for an optical isolator is expressed by the angle changed from 45° of the Faraday rotation angle per 1° C. The standard temperature is commonly 25° C. For example, if the Faraday rotator having a rotation angle of 45° at the standard temperature of 25° C. exhibits the Faraday rotation angle of 42° C., the temperature characteristic or temperature dependency of the Faraday rotator material is 3/25=0.12 (deg/°C.). Generally, the temperature characteristic or temperature dependency of the Faraday rotator material for an optical isolator is referred to as the temperature coefficient of the Faraday rotation angle represented by "α" (hereinafter referred to as temperature coefficient α or simply "α").

As for the isolation (Is) representing the capability of an optical isolator of interrupting reflected and returned light, where the loss in a forward direction is very small, it can be expressed by $10 \times \log_{10}[\sin^2(\Delta\Theta_t)]$ decibel dB) as well known. If the Faraday rotator material with the temperature coefficient α of 0.12 (deg/°C.) as exemplified above is used as a Faraday rotator, the isolation at 50° C. is about 26 dB.

The isolation required for the optical isolator and the environmental temperature used for the optical isolator depend on the system or area in which the optical isolator is used, or object of using it, and so cannot be determined unconditionally. At present, the performance required for the optical isolator is 25 (dB) or so as a comparatively low level isolation, and 30 (Db) or more as a high level isolation. The range of the environmental temperature is 0° C. to 50° C. as a comparatively narrow temperature range on an indoor condition and −20° C. to +70° C. as a wide temperature range on an outdoor condition. Taking the temperature condition and isolation value into consideration, in order to satisfy the isolation of 30 dB in the temperature range of −20° C. to +70° C., a change in the Faraday rotation angle within this temperature range must be ±1.8 (deg), i.e. the temperature coefficient α must be 0.04 (deg/°C.). Further, where the isolation of 25 (dB) is required, the change in the Faraday rotation angle must be ±3.2 (deg), i.e. the temperature coefficient α must be 0.07 (deg/°C.).

In order to satisfy the isolation of 30 dB in the temperature range of 0° C. to 50° C., the temperature coefficient α must be 0.07 (deg/°C.). Further, where the isolation of 25 (dB) is required, the change in the Faraday rotation angle must be ±3.2 (deg), i.e. the temperature coefficient α may be 0.13 (deg/°C.) or so.

In the present technical level in the pertinent technical field, it is very difficult to attain the temperature coefficient α of 0.04 (deg/°C.). It is not too much to say that it is impossible to attain this substantially. On the other hand, under the present conditions, it is easy to attain the temperature coefficient α of 0.13 (deg/°C.). The optical isolator having a Faraday rotator made of optical material with a temperature coefficient of 0.13 (deg/°C.) is limited in its use because of its performance so that it does not have versatility, and so cannot be used as an object for industrial manufacturing.

The recent actualization and spreading of optical communication and optical measurement technology are remarkable. With its popularization, the importance of the optical isolator is recognized again. The requirement for performance is also diversified. As the next best thing, social demands have been made strong for the industrial manufacturing and supply of the Faraday rotator having a temperature coefficient α of 0.07 (deg/°C.) or so within a temperature range of −20° C. to +70° C.

In many cases, the optical isolator is used as a semiconductor module integrated to a semiconductor laser. The entire size of the optical isolator is preferably as small as possible. The shape of the optical isolator is commonly cylindrical, and the size thereof, i.e. diameter is determined by the size of a permanent magnet. The permanent magnet is used to saturate the magnetization of the Faraday rotator. The size of the permanent magnet becomes large in proportion to the saturated magnetic field of the Faraday rotator. For this reason, the saturated magnetic field of the Faraday rotator is desired to be as small as possible.

At present, the permanent magnet actually used in the optical isolator is a samarium(Sm)-cobalt(Co) magnet having a strong magnetic field intensity. The samarium-cobalt magnet, when its size has e.g. an internal diameter of 2 mm, an outer diameter of 4 mm, and a length of 2 mm, forms a magnetic field of 1900 (Oe) or so in an area within 80% of its internal diameter. Therefore, the samarium-cobalt as exemplified above has capability adaptable to the optical material with the saturated magnetic field of the Faraday rotator of 1200 (Oe) or so.

However, when there are components made of iron around the optical isolator, a phenomenon that the magnetic field intensity within the magnet becomes weak occurs. This phenomenon occurs when the magnetic field formed by the cobalt samarium magnet is attracted by the surrounding iron. This will be explained in more detail.

When the exterior of the cobalt samarium magnet having an internal diameter of 2 mm, an outer diameter of 4 mm and a length of 2 mm as exemplified above is covered with a copper cylinder having an internal diameter of 4 mm, thickness of 1 mm and length of 4 mm, the lowest magnetic field of the Faraday rotator within the magnet (in the region of 80% or less of the internal diameter) decreases to 900 (Oe) or so. As a result, the magnetic field of the Faraday rotator becomes unsaturated. This leads to a decrease in the characteristic of an optical isolator, i.e. isolation, and an increase of the loss.

The optical isolator using the Faraday rotator having a saturated magnetic field of 1200 (Oe) is limited in its installation position. In addition, measures of covering the periphery of the optical isolator with a magnetic shielding material are required.

In order to avoid the inconvenience due to the installation location of the optical isolator as described above, the Faraday rotator constituting the optical isolator is preferably made of the material which does not change the characteristic of the Faraday rotator even when the magnetic field formed by the permanent magnet constituting the rotator is varied slightly, i.e., material of the Faraday rotator having a saturated magnetic field, or more concretely, of the material of the Faraday rotator having a saturated magnetic field of 800 (Oe) or less.

Further, the length of the optical isolator depends on the thicknesses of the Faraday rotator, polarizer and analyzer. In order to shorten the length of the optical path in the optical isolator, the thicknesses of the Faraday rotator and/or the polarizer/analyzer must be decreased.

As an actual problem, the thickness of the polarizer/analyzer has been very thin. For example, the glass polarizer manufactured by and available from the Corning Glass Co. Ltd. as a trade name of "polarcor" is 0.2 mm. To decrease the thickness further is very difficult in view of the technical point of view, and also is not preferable in view of industrial economy. Therefore, in order to shorten the length of the optical isolator in the direction of the optical path, there is no other means than decreasing the thickness of the Faraday rotator.

In order to reduce the thickness of the Faraday rotator without impairing the performance of the Faraday rotator, the Faraday effect of the material constituting the Faraday rotator must be increased.

As an actual problem, it is not easy to acquire the material for the Faraday rotator having a great Faraday effect. From the point of view of decreasing the length of the optical isolator in the direction of the optical path, it is preferable that the thickness of the Faraday rotator is equal to or about twice as large as that of the glass polarizer, more specifically 0.2–0.4 mm.

As described above, in order to meet the social demand for the optical isolator, the material for the Faraday rotator must be developed in which the characteristic values, more specifically both the temperature coefficient α of the Faraday rotating angle and a saturated magnetic field are small, and the Faraday effect is great.

The material for the Faraday rotator of an optical isolator which has been generally used is rare earth iron garnet represented by a general Equation $R_3Fe_5O_{12}$ (where R represents a rate earth element) having a great Faraday effect and excellent transparency in a near infrared wavelength region of 1.31 μm or 1.55 μm which has been adopted in optical communication.

There are several kinds of rare earth iron garnets. The representative material fabricated by the floating zone method or melting method is yttrium/iron/garnet ($Y_3Fe_5O_{12}$).

The other material for the Faraday rotator of an optical isolator than $Y_3Fe_5O_{12}$ is bismuth-substituted rare earth iron garnet in which bismuth is substituted for a part of the rare earth element.

The single crystal of bismuth-substituted rare earth iron garnet has the features that it can be fabricated by the liquid phase epitaxial method with good mass production effect and its Faraday effect is about ten-times as large as $Y_3Fe_5O_{12}$. In other words, the Faraday rotator made of bismuth-substituted rare earth iron garnet has a thickness which is about 1/10 times as large as that made of $Y_3Fe_5O_{12}$.

From the point of miniaturizing the optical isolator, as a material for the Faraday rotator of the optical isolator, bismuth-substituted rare earth garnet single crystal is more excellent than $Y_3Fe_5O_{12}$. Further, the bismuth-substituted rare earth iron garnet single crystal has an excellent mass production effect, and is also more advantageous than $Y_3Fe_5O_{12}$ in production cost.

The fact that the Faraday effect of the bismuth-substituted rare earth iron garnet is great has been confirmed by $(YBi)_3Fe_5O_{12}$ fabricated by Yaniguchi using the sintering method (JP Preliminary Publication No. 48-104099). Further, Mikami proposes a method of fabricating bismuth-substituted rare earth iron garnet, more concretely, e.g., $Tb_{3-x}Bi_xFe_5O_{12}[x=0.6-1.1]$ or $Yb_{3-x}Bi_xFe_3O_{12}$ [x=0.6–1.1] (JP Preliminary Publication No. 50-084471].

Thereafter, with development of optical fiber communication, a bismuth-substituted rare earth iron garnet single crystal film made by the liquid phase epitaxial method has been applied to a Faraday rotator for the optical isolator. Further, an investigation has been made for many bismuth-substituted rare earth garnets, e.g. $(HoTbBi)_3Fe_5O_{12}$ (JP Preliminary Publication Hei. 1-217317, U.S. Pat. No. 4,932, 760), $(YbTbBi)_3Fe_5O_{12}$ (JP Preliminary Publication No. 4-076351), and $(GdBi)_3(FeGaAl)_5O_{12}$ (JP Preliminary Publication Sho. 61-020926).

The temperature coefficient α, the degree of the Faraday effect or saturated magnetic field of the bismuth-substituted rare earth iron garnet single crystal depends on the kind and concentration of the components constituting the bismuth-substituted rare-earth iron garnet. Therefore, theoretically, the bismuth-substituted rare earth iron garnet having a desired characteristic can be fabricated or grown by suitably selecting the elements constituting the crystal and precisely controlling the concentration of each component.

However, actually, because of the limitation of a substrate for growing single crystal as described above, under present conditions, the characteristic of the bismuth-substituted rare earth iron garnet cannot be optionally controlled.

The liquid phase epitaxial method is a method of epitaxially growing a certain single crystal on a substrate from the liquid phase. A brief explanation will be given of the bismuth-substituted iron garnet single crystal grown by the liquid phase epitaxial technique.

Garnet components are dissolved in flux components consisting of lead oxide, boron oxide, bismuth oxide in a platinum pot, thereby providing a melting solution for growing garnet single crystal. Next, the temperature of the melting liquid is reduced, and is maintained in an excessive saturated state. When the substrate is brought into contact with the melting liquid in this state, crystal is deposited from the melting liquid on the substrate. In this case, the lattice constants of the substrate and garnet single crystal grown on the substrate are required to be coincident to each other. When the lattice constants are not coincident to each other, a critical problem occurs that the garnet single crystal does not entirely grow or the substrate breaks during crystal growth.

The non-magnetic garnet substrate which is manufactured in an industrial production scale and is available includes two kinds of $Gd_3Ga_5O_{12}$ (hereinafter referred to as "GGG substrate" for simplicity) having a lattice constant of 12.383 Å and $(CaGd)_3(MgZrGa)_5O_{12}$ having a lattice constant of 12.490 Å–12.500 Å (hereinafter referred to as "SGGG substrate" for simplicity). In an actual growth of the bismuth-substituted rare earth iron garnet, since the ion radius of the bismuth is very large, it is very difficult to take lattice alignment of the bismuth-substituted rare earth iron garnet with the GGG substrate. Therefore, only the SGGG substrate is considered to be a substrate for growing bismuth-substituted rare earth iron garnet in an industrial production scale.

Honda et al clarified that $(Tb_{3-x}Bi_x)Fe_5O_{12}$ (JP Preliminary Publication Sho. 50-084471) exhibits the most excellent temperature coefficient α (NIHON OOYOU JIKI GAK-KAISI, 11, No. 2, 157 (1987)). Honda et al say that the bismuth contents of $(Tb_{3-x}Bi_x)FE_5O_{12}$ single crystal grown on the SGGG substrate is 0.87 (x=0.87) atoms/f.u. and the temperature coefficient α is 0.04 deg/°C. or less (at wavelengths of 0.78 μm and 1.31 μm). Since the wavelength dependency of the temperature coefficient α is very small, it is estimated that substantially equal values result at a wavelength of 1.55 μm.

The $(Tb_{3-x}Bi_3)Fe_5O_{12}$ single crystal grown on the SGGG substrate has a very excellent temperature coefficient α. However, on the other hand, it has a problem that its Faraday rotator coefficient is small. For example, in order to obtain the Faraday rotating angle of 45° necessary for the Faraday rotator for an optical isolator, the Faraday rotator must have a thickness as large as 500 μm at a wavelength of 1.55 μm.

Generally, in the bismuth-substituted rare earth iron garnet fabricated by the liquid phase epitaxial method, the substrate is ground, and thereafter, control/adjustment of film thickness for setting the Faraday rotating angle for 45° is required. Thus, in order to obtain the Faraday rotator having a thickness of 500 μm, considering the loss in grinding, the bismuth-substituted rare earth iron garnet single crystal is required which has a further thickness of 50 μm or so added to the thickness of 500 μm. In the liquid phase epitaxial method, if the thickness of the crystal is 500 μm or so, inconvenience in technique and fabrication cost occurs that the number of crystal lattices increases, a slight change between the lattice constants of the substrate and the crystal gives rise to large stress so that the substrate breaks, or the crystal growth time is increased so that the production efficiency lowers.

On the other hand, both $(HoTbBi)_3Fe_5O_{12}$ and $(YbTbBi)_3Fe_5O_{12}$, which have a temperature coefficient α of 0.06 or so, are inferior to $(TbBi)_3Fe_5O_{12}$, but has a feature of the large Faraday effect. For example, the film thickness of the Faraday rotator of $(HoTbBi)_3Fe_5O_{12}$ at a wavelength of 1.55 μm is 360 μm or so. Addition of the thickness of 50

µm required for grinding results in the thickness of 410 µm which can be realized with no problem by the liquid epitaxial method.

However, $(HoTbBi)_3Fe_5O_{12}$ and $(YbTbBi)_3Fe_5O_{12}$ have disadvantages that they have a saturated magnetic field of 1100–1200 Oe or so which is much larger than 800 (Oe) required for the Faraday rotator for an optical isolator. On the other hand, $(GdBi)_3(FeGaAl)_5O_{12}$ has a disadvantage that it has a very small saturated magnetic field of 100 (Oe) and a relatively large temperature coefficient α of 0.08 deg/°C.

The inventors of this invention have investigated and experimented in order to develop the material of the Faraday rotator which satisfies several properties required for the bismuth-substituted rare earth iron garnet used in the Faraday rotator for an optical isolator, i.e. three conditions that (1) the Faraday effect is large, i.e., the film thickness required for the Faraday rotator at a wavelength of 1.55 µm is 400 µm or less, (2) the saturated magnetic field is 800 (Oe) or less, and (3) the temperature coefficient α is 0.07 deg/°C. or less.

As a result, the inventors of this invention have found that bismuth-substituted rare earth iron garnet single crystal film represented by a general equation $Tb_xLu_yBi_{3-x-y}Fe_{5-z}Al_zO_{12}$ (where $0.09 \leq y/x \leq 0.23$, $1.40 \leq x+y \leq 1.60$, $0.20 \leq z \leq 0.38$) can be grown on a non-magnetic garnet substrate $(CaGd)_3(MgZrGa)_5O_{12}$ having a lattice constant of 12.490 Å–12.500 Å by a liquid phase epitaxial method. They have also found that it satisfies several characteristics required for the Faraday rotator for the optical isolator, i.e. three conditions that (1) the Faraday effect is large, i.e., the film thickness required for the Faraday rotator at a wavelength of 1.55 µm is 450 µm or less, (2) the saturated magnetic field is 800 (Oe) or less, and (3) the temperature coefficient α is 0.07 deg/°C. or less. The inventors have further examined the found crystal to complete the present invention.

SUMMARY OF THE INVENTION

An object of the present invention is to provide bismuth-substituted rare earth iron garnet single crystal film represented by a general equation $Tb_3Lu_yBi_{3-x-y}Fe_{5-z}Al_zO_{12}$ (where $0.09 \leq y/z \leq 0.23$, $1.40 \leq x+y \leq 1.70$, $0.20 \leq z \leq 0.38$) can be grown on a non-magnetic garnet substrate $(CaGd)_3(MgZrGa)_5O_{12}$ have a lattice constant of 12.490 Å–12.500 Å by a liquid phase epitaxial method.

Generally, the Faraday effect of the bismuth-substituted rare earth iron garnet increases in proportion to the content of bismuth. In order to reduce the thickness of the Faraday rotator, the content of bismuth in the crystal must be made as high as possible. But, when the content of bismuth is increased, since the ion radius of bismuth is large, the lattice constant of the bismuth-substituted rare earth iron single crystal becomes larger than that of the substrate so that lattice alignment between the crystal and the substrate cannot be obtained. This gives rise to inconvenience that the single crystal film grown on the substrate breaks or cracks, or conversely the substrate breaks during crystal growth, thus hindering normal epitaxial growth.

Thus, in order to increase the bismuth content of $(TbBi)_3Fe_5O_{12}$ bismuth-substituted rare earth iron garnet single crystal, the inventors of the present invention have substituted an element having a smaller ion diameter than terbium Tb for a part of terbium. Several kinds of experiments for a dual element system consisting of terbium and the other rare earth element have been done. As a result, it has been found that as the rare earth element, lutetium Lu is efficient, i.e., the rare earth element of a dual system consisting of terbium and lutetium is optimum. The rare earth elements other than lutetium Lu, e.g. yttrium Yb, thorium Tm or erbium Er as the other rare earth element are not preferable since they decrease the Faraday rotating coefficient.

Substitution of Lu for a part of terbium Tb increases a kind of the lattice defect having a shape of an inverted triangular pyramid called "pit" in accordance with an increase in the amount of substitution. The pit, which increases insertion loss, is an impermissible defect as the Faraday rotator for an optical isolator.

In the epitaxial growth of the bismuth-substituted rare earth iron garnet single crystal, generation of pits cannot be eliminated. Namely, in the epitaxial growth technique at present, creation of pits is more or less inevitable, and in an industrial practice, creation of pits is inevitably permissible to some extent.

The standard size of the Faraday rotator at present is a square of 2 mm×2 mm. The portion which transmits signal light, i.e., valid diameter is within the circle having a diameter of 1.6 mm at the center portion. It is empirically known that the relation between the size of pit and insertion loss, i.e., the limit of the size of the pit is 30 µm in one side. Thus, from the practical point of view, the pit having a side of 30 µm is permissible. Therefore, existence of the pit having a side of 30 µm or more in an efficient diameter leads to poor products.

In an industrial growth of the bismuth-substituted rare earth iron garnet single crystal, according to the working standard of restricting the inferiority rate to 50% due to pits, the permissible pit density is $0.25/mm^2$ [=0.5/ (0.8×0.8×π)]. Now, setting the inferiority rate due to pits for 20% or less leads to a pit density of $0.1/mm^2$ or $10/cm^2$.

In order to satisfy the social demand for the quality/performance of an optical isolator, the inventors of the present invention have developed bismuth-substituted rare earth iron garnet single crystal optimal for the Faraday rotator for an optical isolator and performed investigation or experimentation for the single crystal under developing standards of industrially fabricating such a single crystal at a low cost that (1) the film thickness required for the Faraday rotator having a wavelength of 1.55 µm is 450 µm or less; (2) the saturated magnetic field is 800 (Oe) or less; (3) the temperature coefficient α is 0.07 deg/°C. and (4) the pit density is $10/cm^2$.

As a result, it was found that the substitution of Lu for a part of terbium Tb increases the number of pits in accordance with an increase in the amount of substitution and increases the saturated magnetic field.

An increase in the saturated magnetic field can be prevented and restricted by substituting non-magnetic elements such as gallium, silicon and aluminum for a part of iron. But, partial substitution of non-magnetic elements for iron deteriorates the temperature coefficient α, and as the case may be, led to an unfavorable phenomenon that the Faraday effect lowers.

This suggests that there is an optimum condition for the kind of non-magnetic elements and the amount of substitution when non-magnetic elements are substituted for iron. On the basis of this teaching, the inventors of the present invention have performed detailed experiments on the relation between the kind of non-magnetic elements and the saturated magnetic field, temperature coefficient α and Faraday effect to find that aluminum is efficient for reduction of the saturated magnetic field, has a preferable temperature coefficient α and does not reduce the Faraday effect greatly.

The bismuth-substituted rare earth iron garnet single crystal according to the present invention is bismuth-substituted rare earth iron garnet single crystal film represented by a general equation $Tb_xLu_yBi_{3-x-y}Fe_{5-z}Al_zO_{12}$ (where $0.09 \leq y/x \leq 0.23$, $1.40 \leq x+y \leq 1.70$, $0.20 \leq z \leq 0.38$) grown on a non-magnetic garnet substrate $(CaGd)_3(MgZrGa)_5O_{12}$ having a lattice constant of 12.490 Å–12.500 Å by a liquid phase epitaxial method.

In putting the present invention into practice, when the ratio of lutetium Lu and terbium Tb, i.e. the value of y/x is selected to be 0.09 or less, the Faraday effect lowers. This is not preferable since the film thickness required as the Faraday rotator increases. Further, when the ratio of lutetium Lu and terbium Tb, i.e., the value of y/x is selected to be 0.23 or larger, the density of pits becomes $10/cm^2$ or more, thus disadvantageously reducing the product yield.

Further, in putting the present invention into practice, when the sum of terbium Tb and lutetium Lu, i.e., the value of x+y is selected to be lower than 1.40 or less, namely the concentration (3-x-y) of bismuth Bi is selected to be 1.6 (atoms/f.u.) or more, the pit density becomes $10/cm^2$ or more, thus disadvantageously reducing the product yield. When the sum of terbium Tb and lutetium Lu, i.e. the value of x+y is selected to be 1.70 (atoms/f.u.) or more, namely the concentration of (3-x-y) of bismuth Bi is selected to be 1.30 (atoms/f.u.) or less, the Faraday effect lowers. This is not preferable since the film thickness required as the Faraday rotator increases.

Further, in putting the present invention into practice, the amount of aluminum Al, i.e., the value of z is selected to be 0.2 or less, the saturated magnetic field required for the Faraday rotator exceeds 800 (Oe) disadvantageously. When the amount of aluminum Al, the value of z is selected to be 0.38 or more, the temperature coefficient α exceeds 0.07 deg/°C. This cannot satisfy the performance required for the Faraday rotator for an optical isolator. As a result, the required object cannot be attained.

In accordance with the present invention, an optical isolator which is installed in the place where iron products are present can be provided industrially and at low cost.

The above and other objects and features of the present invention will be more apparent from the following description taken in conjunction with the accompanying drawings.

DESCRIPTION OF THE PREFERRED EMBODIMENTS

Figure 1:
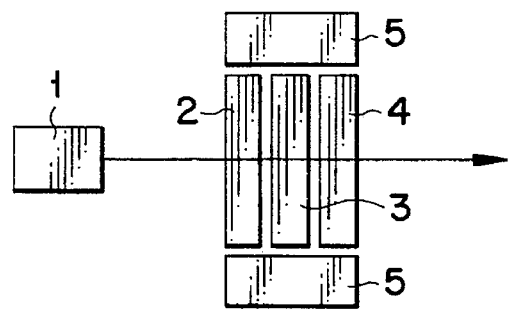
FIG. 1 is a schematic view of the entire arrangement of an optical isolator.
Figure 2:
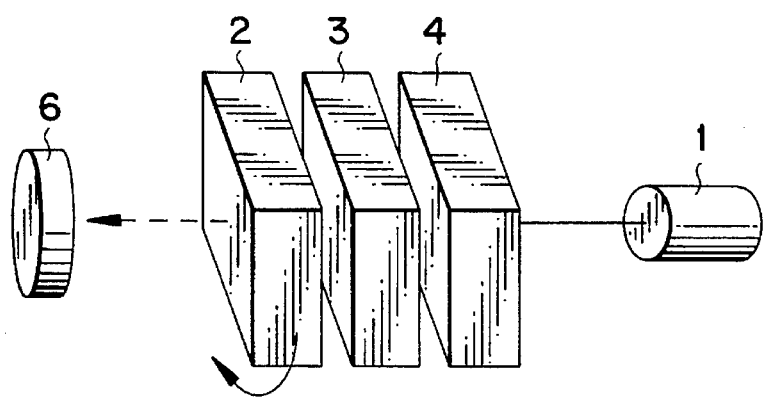
FIG. 2 is a view showing one example of the method of assembling the optical isolator.

Now referring to the drawings, a concrete and detailed explanation will be given of several embodiments of the present invention in connection with their forms and effects. It is not intended that the scope of the present invention and the form of putting it into practice are limited.

EMBODIMENT 1

In a platinum crucible having a capacity of 1500 ml, lead oxide [PbO, 4N] of 2700 g, bismuth oxide [$Bi_2O_3$, 4N] of 2400, ferric oxide ($Fe_2O_3$, 4N) of 340 g, boron oxide ($B_2O_3$, 5N) of 120 g, terbium oxide ($Tb_4O_7$, 3N) of 34 g, lutetium oxide ($Lu_2O_3$, 3N) of 5 g and aluminum oxide ($Al_2O_3$) of 9.0 g have been prepared. It was set at a predetermined position of a precise longitudinal tubular electric furnace. These compounds were heated and molten at 1000°C., until sufficiently stirred to be mixed uniformly. Then, the melt thus obtained was cooled to 777°C. to grow a bismuth-substituted rare earth iron garnet single crystal.

Figure 3:
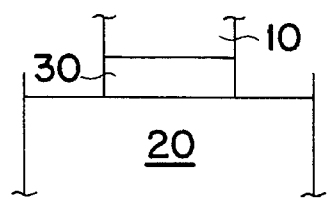
FIG. 3 shows a bismuth substituted rare earth iron garnet single crystal film grown on a non-magnetic garnet substrate in accordance with the invention.

According to the ordinary technique, the one side of a (111) garnet single crystal [$(GdCa)_3(GaMgZr)_5O_{12}$] substrate 10, as shown in FIG. 3 having a thickness of 480 μm, a lattice constant of 12.497±0.002 Å and a diameter of 1 inch was brought into contact with the surface of the melt 20. While the temperature of the melt is maintained at 777°C., the epitaxial growth was performed to provide a $(TbLuBi)_3(FeAl)_5O_{12}$ single crystal film 30 having a thickness of 452 μm [TbLuBiFeAlG single crystal film (1)].

Next, the TbLuBiFeAlG single crystal film (1) was cut into a size of 10 mm×10 mm [TbLuBiFeAlG single crystal (1) one sample piece], and the substrate was removed by grinding. Further, the thickness of the crystal was adjusted by grinding so that the Faraday rotating angle exhibits about 45° at a wavelength of 1.55 μm.

The TbLuBiFeAlG single crystal—one sample piece has the following characteristics.

Thickness: 384 μm

Faraday rotating angle: 44.6°

Temperature coefficient: 0.063 deg/°C.

Saturated magnetic field: 730 Oe

Composition: $Tb_{1.38}Lu_{0.21}Bi_{1.41}Fe_{4.72}Al_{0.28}O_{12}$

Pit density: $6/cm^2$

Incidentally, these characteristics and composition were measured by the following technique.

One piece of the TbLuBiFeAlG single crystal having a size of 10 mm×10 mm was cut into a size of 2 mm x 2 mm to provide 25 (twenty five) TbLuBiFeAlG single crystals (cut products). One of the cut products of TbLuBiFeAlG single crystal films was centrally arranged in a magnetic field generating device (magnet) consisting of coils available from MAGNETIC CO. LTD. With a magnetic field applied, semiconductor laser light having a wavelength of 1.55 μm was projected on the TbLuBiFeAlG single crystal film (one cut product). As the magnetic field being applied is gradually increased, the rotating angle of the polarized surface of the laser light which has permeated through the TbLuBiFeAlG single crystal (one cut product) was measured. The rotating angle of the polarized light and the applied magnetic field when the rotating angle of the polarized plane ceases to vary were set as the Faraday rotating angle and the saturated magnetic field of the TbLuBiFeAlG single crystal (1).

Further, one of the cut products of TbLuBiFeAlG single crystal films, which is fixed by a fixing jig of brass, was inserted into a cylindrical samarium-cobalt magnet. The integrated product of the samarium-cobalt magnet (TbLuBiFeAlG single crystal—one cut product) was introduced into a heating/cooling chamber available from SURUGA SEIKI CO. LTD., and heated and cooled within the temperature range of —20° C. to 70° C. Simultaneously, the semiconductor laser light having a wavelength of 1.55 μm was projected on the TbLuBiFeAlG single crystal (one cut product) to measure the rotating angle of the permeated polarized light. The rotating angle of the polarized plane thus obtained was linearly approximated to acquire the temperature coefficient α.

Further, the TbLuBiFeAlG single crystal (1) was analyzed by the following technique.

The TbLuBiFeAlG single crystal (one cut product) was crushed to gather about 10 mg. It was dissolved in a solution of hydrochloric acid and nitric acid. Next, using the element analysis by the ICP light emitting analyzing technique, the element composition of the TbLuBiFeAlG single crystal film (1) was acquired.

The pit density was acquired by the following technique. Any optional five products of the TbLuBiFeAl single films (cut products) were selected and observed by the infrared microscope available from OLYMPUS KOUGAKU CO. LTD. to count the number of pits each having one side length of 30 μm or more. Its arithmetic average value was acquired by the ordinary technique.

EMBODIMENT 2

In a platinum crucible having a capacity of 1500 ml, lead oxide [PbO, 4N] of 2900 g, bismuth oxide [$Bi_2O_3$, 4N] of 2500 g, ferric oxide ($Fe_2O_3$, 4N) of 350 g, boron oxide ($B_2O_3$, 5N) of 120 g, terbium oxide ($Tb_4O_7$, 3N) of 34 g, lutetium oxide ($Lu_2O_3$, 3N) of 3.7 g and aluminum oxide ($Al_2O_3$, 3N) of 11 g have been prepared. It was set at a predetermined position of a precise longitudinal tubular electric furnace. These compounds were heated until and molten at 1000°C., and sufficiently stirred to be mixed uniformly. Then, the melt thus obtained was cooled to 782°C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 480 μm, a lattice constant of 12.497±0.002 Å and a diameter of 1 inch was brought into contact with the surface of the melt. While the temperature of the melt is maintained at 782°C., the epitaxial growth was performed to provide a $(TbLuBi)_3(FeAl)_5O_{12}$ single crystal film having a thickness of 440 μm [TbLuBiFeAlG single crystal film (2)].

The TbLuBiFeAlG single crystal (2) having the following characteristics was obtained by entirely the same way as in Embodiment 1.

Thickness: 379 μm
Faraday rotating angle: 45.2°
Temperature coefficient: 0.064 deg/°C.
Saturated magnetic field: 750 Oe
Composition: $Tb_{1.41}Lu_{0.14}Bi_{1.45}Fe_{4.65}Al_{0.35}O_{12}$
Pit density: 5/cm²

EMBODIMENT 3

In a platinum crucible having a capacity of 1500 ml, lead oxide [PbO, 4N] of 2500 g, bismuth oxide [$Bi_2O_3$, 4N] of 2700 g, ferric oxide ($Fe_2O_3$, 4N) of 390 g, boron oxide ($B_2O_3$, 5N) of 120 g, terbium oxide ($Tb_4O_7$, 3N) of 34 g, lutetium oxide ($Lu_2O_3$, 3N) of 7.5 g and aluminum oxide ($Al_2O_3$, 3N) of 13 g have been prepared. It was set at a predetermined position of a precise longitudinal tubular electric furnace. These compounds were heated until molten at 1000°C., and sufficiently stirred to be mixed uniformly. Then, the melt thus obtained was cooled to 763°C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 480 μm, a lattice constant of 12.497±0.002 Å and a diameter of 1 inch was brought into contact with the surface of the melt. While the temperature of the melt is maintained at 763°C., the epitaxial growth was performed to provide a $(TbLuBi)_3(FeAl)_5O_{12}$, single crystal film having a thickness of 480 μm [TbLuBiFeAlG single crystal film (3)].

The TbLuBiFeAlG single crystal (3) having the following characteristics was obtained by entirely the same way as in Embodiment 1.

Thickness: 365 μm
Faraday rotating angle: 45.6°
Temperature coefficient: 0.066 deg/°C.
Saturated magnetic field: 790 Oe
Composition: $Tb_{1.22}Lu_{0.23}Bi_{1.55}Fe_{4.64}Al_{0.36}O_{12}$
Pit density: 9 cm²

EMBODIMENT 4

In a platinum crucible having a capacity of 1500 ml, lead oxide [PbO, 4N] of 2600 g, bismuth oxide [$Bi_2O_3$, 4N] of 2500 g, ferric oxide ($Fe_2O_3$, 4N) of 370 g, boron oxide ($B_2O_3$, 5N) of 120 g terbium oxide ($Tb_4O_7$, 3N) of 34 g, lutetium oxide ($Lu_2O_3$, 3N) of 3.7 g and aluminum oxide ($Al_2O_3$, 3N) of 7.5 g have been prepared. It was set at a predetermined position of a precise longitudinal tubular electric furnace. These compounds were heated until molten at 1000°C., and sufficiently stirred to be mixed uniformly. Then, the melt thus obtained was cooled to 791°C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 480 μm, a lattice constant of 12.493±0.002 Å and a diameter of 1 inch was brought into contact with the surface of the melt. While the temperature of the melt is maintained at 791°C., the epitaxial growth was performed to provide a $(TbLuBi)_3(FeAl)_5O_{12}$ single crystal film having a thickness of 447 μm [TbLuBiFeAlG single crystal film (4)].

The TbLuBiFeAlG single crystal (4) having the following characteristics was obtained by entirely the same way as in Embodiment 1.

Thickness: 400 μm
Faraday rotating angle: 45.1°
Temperature coefficient: 0.061 deg/°C.
Saturated magnetic field: 740 Oe
Composition: $Tb_{1.53}Lu_{0.15}Bi_{1.32}Fe_{4.80}Al_{0.20}O_{12}$
Pit density: 6/cm²

Comparative Example 1

In a platinum crucible having a capacity of 1500 ml, lead oxide [PbO, 4N] of 2500 g, bismuth oxide [$Bi_2O_3$, 4N] of 2700 g, ferric oxide ($FE_2O_3$, 4N) of 390 g, boron oxide ($B_2O_3$, 5N) of 120 g, terbium oxide ($Tb_4O_7$, 3N) of 34 g, lutetium oxide ($Lu_2O_3$, 3N) of 9.0 g and aluminum oxide ($Al_2O_3$, 3N) of 13 g have been prepared. It was set at a predetermined position of a precise longitudinal tubular electric furnace. These compounds were heated until molten at 1000°C., and sufficiently stirred to be mixed uniformly. Then, the melt thus obtained was cooled to 798°C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 500 μm, a lattice constant of 12.497±0.002 Å and a diameter of 1 inch was brought into contact with the surface of the melt. While the melting temperature is maintained at 798° C., the epitaxial growth was performed to provide a $(TbLuBi)_3(FeAl)_5O_{12}$ single crystal film having a thickness of 485 μm [TbLuBiFeAlG single crystal film (5)].

The TbLuBiFeAlG single crystal (4) having the following characteristics was obtained by entirely the same way as in Embodiment 1.

Thickness: 440 μm

Faraday rotating angle: 45.4°

Temperature coefficient: 0.0.61 deg/°C.

Saturated magnetic field: 780 Oe

Composition: $Tb_{1.10}Lu_{0.27}Bi_{1.63}Fe_{4.62}Al_{0.38}O_{12}$

Pit density: 15 cm/$^2$

Comparative Example 2

In a platinum crucible having a capacity of 1500 ml, lead oxide [PbO, 4N] of 2500 g, bismuth oxide [$Bi_2O_3$, 4N] of 2700 g, ferric oxide ($FE_2O_3$, 4N) of 370 g, boron oxide ($B_2O_3$, 5N) of 120 g, terbium oxide ($Tb_4O_7$, 3N) of 34 g, lutetium oxide ($Lu_2O_3$, 4N) of 2.6 g and aluminum oxide ($Al_2O_3$, 3N) of 5.0 g have been prepared. It was set at a predetermined position of a precise longitudinal tubular electric furnace. These compounds were heated until molten at 1000°C., and sufficiently stirred to be mixed uniformly. Then, the melt thus obtained was cooled to 780°C. to grow a bismuth-substituted rare earth iron garnet single crystal.

According to the ordinary technique, the one side of a (111) garnet single crystal [$(GdCa)_3(OaMgZr)_5O_{12}$] substrate having a thickness of 500 μm, a lattice constant of 12.497±0.002 l and a diameter of 1 inch was brought into contact with the surface of the melting liquid. While the temperature of the melt is maintained at 780°C., the epitaxial growth was performed to provide a $(TbLuBi)_3(FeAl)_5O_{12}$ single crystal film having a thickness of 515 μm [TbLuBiFeAlG single crystal film (6)].

The TbLuBiFeAlG single crystal (6) having the following characteristics was obtained by entirely the same way as in Embodiment 1.

Thickness: 455 μm

Faraday rotating angle: 44.7°

Temperature coefficient: 0.058 deg/°C.

Saturated magnetic field: 800 Oe

Composition: $Tb_{1.74}Lu_{0.12}Bi_{1.14}Fe_{4.85}Al_{0.15}O_{12}$

Pit density: 13/cm$^2$

Comparative Example 3

In a platinum crucible having a capacity of 1500 ml, lead oxide [PbO, 4N] of 2500 g, bismuth oxide [$Bi_2O_3$, 4N] of 2700 g, ferric oxide ($Fe_2O_3$, 4N) of 370 g, boron oxide ($B_2O_3$, 5N) of 120 g, terbium oxide ($Tb_4O_7$, 3N) of 34 g, lutetium oxide ($Lu_2O_3$, 3N) of 3.7 g and aluminum oxide ($Al_2O_3$, 3N) of 15 g have been prepared. It was set at a predetermined position of a precise longitudinal tubular electric furnace. These compounds were heated until molten at 1000°C., and sufficiently stirred to be mixed uniformly. Then, the melt thus obtained was cooled to 765°C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 500 μm, a lattice constant of 12.497±0.002 Å and a diameter of 1 inch was brought into contact with the surface of the melt. While the temperature of the melt is maintained at 765° C., the epitaxial growth was performed to provide a $(TbLuBi)_3(FeAl)_5O_{12}$ single crystal film having a thickness of 425 μm [TbLuBiFeAlG single crystal film (6)].

The TbLuBiFeAlG single crystal (4) having the following characteristics was obtained by entirely the same way as in Embodiment 1.

Thickness: 381 μm

Faraday rotating angle: 44.7°

Temperature coefficient: 0.072 deg/°C.

Saturated magnetic field: 690 Oe

Composition: $Tb_{1.25}Lu_{0.13}Bi_{1.62}Fe_{4.56}Al_{0.44}O_{12}$

Pit density: 13/cm$^2$

Comparative Example 4

In a platinum crucible having a capacity of 1500 ml, lead oxide [PbO, 4N] of 2700 g, bismuth oxide [$Bi_2O_3$, 4N] of 2400 g, ferric oxide ($Fe_2O_3$, 4N) of 340 g, boron oxide ($B_2O_3$, 5N) of 120 g, terbium oxide ($Tb_2O_3$, 3N) of 34 g, lutetium oxide ($Lu_2O_3$, 3N) of 7.5 g and aluminum oxide ($Al_2O_3$, 3N) of 20 g have been prepared. It was set at a predetermined position of a precise longitudinal tubular electric furnace. These compounds were heated until molten at 1000°C., and sufficiently stirred to be mixed uniformly. Then, the melt thus obtained was cooled to 782°C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 500 μm, a lattice constant of 12.497±0.002 Å and a diameter of 1 inch was brought into contact with the surface of the melt. While the temperature of the melt is maintained at 782°C., the epitaxial growth was performed to provide a $(TbLuBi)_3(FeAl)_5O_{12}$ single crystal film having a thickness of 530 μm [TbLuBiFeAlG single crystal film]. Incidentally, the crystal growth was performed three times. Then, the substrate broke twice during the crystal growth. The TbLuBiFeAlG single crystal having the following characteristics was obtained by entirely the same way as in Embodiment 1.

Thickness: 484 μm

Faraday rotating angle: 45.6°

Temperature coefficient: 0.064 deg/°C.

Saturated magnetic field: 730 Oe

Composition: $Tb_{1.53}Lu_{0.31}Bi_{1.16}Fe_{4.66}Al_{0.34}O_{12}$

Pit density: 7/cm$^2$

Comparative Example 5

In a platinum crucible having a capacity of 1500 ml, lead oxide [PbO, 4N] of 2700 g, bismuth oxide [$Bi_2O_3$, 4N] of 2400 g, ferric oxide ($Fe_2O_3$, 4N) of 340 g, boron oxide ($B_2O_3$, 5N) of 120 g, terbium oxide ($Tb_4O_7$, 3N) of 34 g, erbium oxide ($Er_2O_3$) of 8 g and aluminum oxide ($Al_2O_3$, 3N) of 20 g have been prepared. It was set at a predetermined position of a precise longitudinal tubular electric furnace. These compounds were heated and molten at 1000°C., and sufficiently stirred to be mixed uniformly. Then, the melt thus was cooled to 778°C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 500 µm, a lattice constant of 12.493±0.002 Å and a diameter of 1 inch was brought into contact with the surface of the melt. While the temperature of the melt is maintained at 778° C., the epitaxial growth was performed to provide a $(TbErBi)_3(FeAl)_5O_{12}$ single crystal film having a thickness of 555 µm [TbErBiFeAlG single crystal film]. Incidentally, the TbErBiFeAlG single crystal film cracked at four positions.

The TbErBiFeAlG single crystal having the following characteristics was obtained by entirely the same way as in Embodiment 1 was obtained.

Thickness: 491 µm

Faraday rotating angle: 45.0°

Temperature coefficient: 0.060 deg/°C.

Saturated magnetic field: 750 Oe

Composition: $Tb_{1.53}Er_{0.35}Bi_{1.12}Fe_{4.73}Al_{0.27}O_{12}$

Pit density: 4/cm²

We claim:

1. A bismuth-substituted rare earth iron garnet single crystal film represented by a general equation $Tb_xLu_yBi_{3-x-y}Fe_{5-z}Al_zO_{12}$ wherein $0.09 \leq y/x \leq 0.23$, $1.40 \leq x+y \leq 1.70$, and $0.20 \leq z \leq 0.38$, the film having been grown on a non-magnetic garnet substrate $(CaGd)_3(MgZrGa)_5O_{12}$ having a lattice constant of 12.490 Å–12.500 Å by a liquid phase epitaxial method.

2. A bismuth-substituted rare earth iron garnet single crystal film according to claim 1, wherein x=1.38, y=0.21 and z=0.28, and the $(CaGd)_3(MgZrGa)_5O_{12}$ substrate has a lattice constant of 12.497±0.002 Å.

3. A bismuth-substituted rare earth iron garnet single crystal film according to claim 1, wherein x=1.41, y=0.14 and z=0.35, and the $(CaGd)_3(MgZrGa)_5O_{12}$ substrate has a lattice constant of 12.497±0.002 Å.

4. A bismuth-substituted rare earth iron garnet single crystal film according to claim 1, wherein x=1.22, y=0.23 and z=0.36, and the $(CaGd)_3(MgZrGa)_5O_{12}$ substrate has a lattice constant of 12.497±0.002 Å.

5. A bismuth-substituted rare earth iron garnet single crystal film according to claim 1, wherein x=1.53, y=0.15 and z=0.20, and the $(CaGd)_3(MgZrGa)_5O_{12}$ substrate has a lattice constant of 12.493±0.002 Å.

6. A Faraday rotator for an optical isolator constituted by the bismuth-substituted rare earth garnet single crystal film as set forth in claim 1.

7. A bismuth-substituted rare earth iron garnet single crystal film according to claim 1, exhibiting a saturated magnetic field of $\leq 800$ Oe.

8. A bismuth-substituted rare earth iron garnet single crystal film according to claim 1, exhibiting a temperature coefficient α of $\leq 0.07$ deg/°C.

9. A bismuth-substituted rare earth iron garnet single crystal film according to claim 1, exhibiting a pit density of $\leq 10/cm^2$.

10. A bismuth-substituted rare earth iron garnet single crystal film according to claim 1, having a thickness of $\leq 450$ µm and exhibiting Faraday rotation of about 45° at a wavelength of 1.55 µm.

* * * * *